United States Patent [19]

Watkinson

[11] 4,454,484

[45] Jun. 12, 1984

[54] PHASE-LOCKED LOOP INCLUDING AN AMPLIFIER CIRCUIT ARRANGEMENT

[75] Inventor: Stephen W. Watkinson, Cambridge, England

[73] Assignee: U.S. Philips Corporation, New York, N.Y.

[21] Appl. No.: 276,133

[22] Filed: Jun. 22, 1981

[30] Foreign Application Priority Data

Jul. 2, 1980 [GB] United Kingdom ............... 8021659

[51] Int. Cl.³ .......................... H03L 7/00; H03F 3/68
[52] U.S. Cl. ..................................... 331/17; 328/143; 328/165; 330/126; 330/149; 455/260
[58] Field of Search ................. 330/126, 149; 331/17; 455/260, 255, 256; 328/143, 147, 162, 165, 169

[56] References Cited

U.S. PATENT DOCUMENTS 1,705,993  3/1929  Oswald ........................ 328/169 X
4,135,159  1/1979  Kubanoff ..................... 330/149 X Primary Examiner—James B. Mullins Attorney, Agent, or Firm—Thomas A. Briody; William J. Streeter; Edward W. Goodman

[57] ABSTRACT

An amplifier circuit arrangement comprises an inverting (2) and a non-inverting amplifier (4) connected between a common input (1) and respective inputs of a summing circuit (6). The gains of the amplifiers are unequal for low amplitude input signals but are arranged to produce substantially equal antiphase limited outputs for high amplitude input signals. By making the gains of the amplifiers greater than the difference between their gains, a rapid transition is obtained from a situation where the gain of the arrangement corresponds to the numerical difference between the amplifier gains, to one where it has fallen to a low level. This property can be used in a phase-locked loop of which four examples are given, when the beat frequency output of a phase sensitive detector connected to the input of the amplifier arrangement is large, the output of the summing circuit (6) will be low. Conversely, when the phase sensitive detector falls to a low level indicating that a frequency lock is obtained, the output of the summing circuit will be high.

3 Claims, 6 Drawing Figures

PHASE-LOCKED LOOP INCLUDING AN AMPLIFIER CIRCUIT ARRANGEMENT

BACKGROUND OF THE INVENTION

The invention relates to an amplifier circuit arrangement, a phase lock loop including such an amplifier arrangement, and a radio receiver including such an amplifier or phase lock loop.

When designing portable radio receivers, particularly narrow band multi-channel receivers, it is useful to employ automatic frequency control (AFC). This gives the advantage of maintaining the intermediate frequency (IF) signal in the center of the IF filter pass band when the local oscillator frequency drifts due to temperature changes or component ageing. Also the distortion produced in the receiver is minimized and matching of the crystal filter becomes less critical. In addition, the performance of a muting circuit can be maintained when the local oscillator frequency drifts.

However, in multi-channel receivers, the automatic frequency control circuit may be affected by strong signals in channels adjacent to the selected channel. This particularly applies in a receiver which works on the principle of a dual phase-locked loop. Such a receiver is described in a paper read by Stephen W. Watkinson at the Communications 74 Conference held in Brighton, England, during July 1974 and published in the Conference Proceedings at pages 13.1/1 to 13.1/8, the contents of which are hereby incorporated by reference. In this system a very high level adjacent channel signal will produce a beat frequency with the intermediate frequency voltage controlled crystal oscillator (IFVCXO). This waveform will frequency modulate the IFVCXO producing a non-sinusoidal error waveform containing a d.c. component. The d.c. component will be fed to the local oscillator causing its frequency to be pulled towards the frequency of the adjacent channel signal thus reducing the rejection of the adjacent channel signal. If the level of the adjacent signal is now reduced, the pulling effect may be maintained typically down to a level to 30 dB below that at which is started.

This problem may be reduced by including a low-pass filter in the feed-back path to the IFVCXO but if the filter has a rapid roll-off, the loop may become unstable. In practice, the loop filter must be limited to a single pole network and consequently, for a 12.5 KHz channel spacing, the attenuation of the 12.5 KHz beat frequency is not sufficient to overcome the problem. An alternative arrangement would be to include a notch filter such as a Twin-Tee circuit, with the notch frequency at the difference between the selected channel and adjacent channel frequencies. However, if the notch is too deep, loop instability will again be produced because of the reactive components in the notch filter circuit.

SUMMARY OF THE INVENTION

It is an object of the invention to provide a circuit arrangement which, when incorporated in a phase-locked loop, reduces the tendency of the loop to be pulled towards an adjacent channel and furthermore avoids the use of filters which include reactive components.

According to the present invention there is provided an amplifier circuit arrangement comprising an input for receiving an input signal to be amplified, means for connecting the input to an input of a first amplifier which is arranged to produce at its output a signal in phase with that applied to its input, means for connecting the input of the circuit arrangement to an input of a second amplifier which is arranged to produce at its output a signal in antiphase with that applied to its input, and means for summing the outputs of the first and second amplifiers, the output of the summing means being the output of the circuit arrangement, wherein the gains of the first and second amplifiers are unequal for low amplitude input signals and the first and second amplifiers are arranged to produce substantially equal antiphase limited outputs for high amplitude input signals.

A high-pass filter may be connected between the output of either the first or second amplifier and the summing means. When the arrangement is used as part of a phase-locked loop, as described hereinafter, the cut-off frequency of the filter which may be 3.5 KHz will define the lock-in range of the loop.

When it is desired to produce a fast transition between low signal gain of the arrangement and minimum output, the difference between the gains of the first and second amplifiers is selected to be less than the lower of the two gains.

The present invention also provides a phase-locked loop comprising a phase sensitive detector having first and second inputs and an output, means for feeding an input signal to the first input of the phase sensitive detector, a controllable oscillator and means for feeding the output of the oscillator to the second input of the phase sensitive detector, wherein the output of the phase sensitive detector is fed to a control input of the oscillator via an amplifier circuit arrangement in accordance with the invention.

The phase-locked loop may further comprise means for adding a sweep waveform to the output of the amplifier circuit arrangement and means for cancelling the sweep waveform when the loop is locked. This enables the loop to lock in the absence of the provision of the high-pass filter.

In a modification of the phase-locked loop, the phase sensitive detector is replaced by second and third phase sensitive detectors each having first and second inputs and an output, the second inputs of the second and third phase sensitive detectors being commoned and connected to the output of the controlled oscillator and in which the input signal is fed to the first input of the second phase sensitive detector and is inverted and fed to the first input of the third phase sensitive detector and in which the output of the second phase sensitive detector is fed to the input of the first amplifier and the output of the third phase sensitive detector is fed to the second amplifier, the second amplifier being modified to give an output in phase with the signal applied to its input.

The phase-locked loop as defined above may be included in a superheterodyne radio receiver in which the output of the intermediate frequency (I.F.) stage is fed to the first input of the second phase sensitive detector and the output of the first amplifier is fed to the control input of a further controlled oscillator forming the receiver local oscillator via a low-pass filter.

The radio receiver may further comprise a fourth phase sensitive detector having first and second inputs and an output, means for applying the output of the I.F. stage to the first input thereof, means for applying the output of the first mentioned controlled oscillator to the second input thereof through a 90° phase shifting network and means for feeding the output of the fourth phase sensitive detector to a mute circuit to control the operation thereof.

DESCRIPTION OF THE DRAWINGS

The present invention will now be described, by way of example, with reference to the accompanying drawings, in which.

DESCRIPTION OF THE PREFERRED EMBODIMENTS

Figure 1:
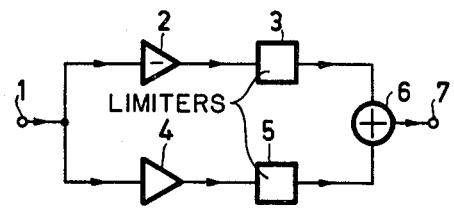
FIG. 1 shows an amplifier circuit arrangement in accordance with the invention.

As shown in FIG. 1, the amplifier circuit arrangement comprises an input 1 which is fed to the input of an inverting amplifier 2 and to the input of a non-inverting amplifier 4. The output of the amplifier 2 is fed via a limiter 3 to a first input of the summing circuit 6. The output of amplifier 4 is fed via limiter 5 to a second input of the summing circuit 6. The output of the summing circuit 6 is fed to an output 7 of the amplifier circuit arrangement. The two limiters 3 and 5, may be the limiting output characteristics of the two amplifiers 2 and 4, respectively.

Figure 2:
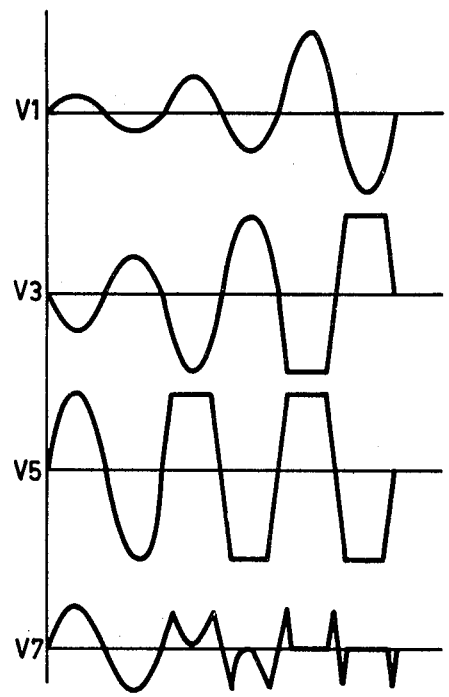
FIG. 2 shows various waveforms occurring within the amplifier circuit arrangement of FIG. 1.

As can be seen from the waveforms shown in FIG. 2, when a low level input, signal V1 is applied to input 1 the output signal V7 at the output 7 is an amplified version of the input signal, the gain of the circuit arrangement being equal to the difference between gains of amplifiers 2 and 4. When the amplitude of the input signal is increased to high level the inputs V3 and V5 of the summing circuit will be limited and, as they are in antiphase, will cancel and hence the output signal at the output 7 is theoretically zero. At an intermediate level of input signal, one of the amplifiers will give a limited output while the other does not and hence cancellation will not be achieved and an element of uncertainty is introduced. The region of uncertainty will be progressively reduced as the gain of both amplifiers is increased while keeping differences between the gains constant. As an example, if the required gain for low level signals is 100, this can be achieved by setting gain of amplifier 2 to 150 and that of amplifier 4 to 50. In this case, the change in input level between onset of limiting in one signal path and the onset of limiting in the other signal path will be the ratio of the gains, i.e. (150/50)=3, or 10 dB change in input signal level. However, if the gain amplifier 2 is set to 500, and that of amplifier 4 to 400, the gain of the arrangement for low level signals will remain at 100 but the change in input level between the onset of limiting in one signal path and the onset of limiting in the other signal path will be (500/400)=1.25, a change of input signal level of 2 dB. Thus the second case will provide a more rapid transition from the condition where the gain is a 100 to that where it has fallen to a low level.

If the arrangement shown in FIG. 1 is included in the error path of a phase-locked loop, it will be found to have a zero lock-in range, however the hold-in range would be the same as that with a normal loop amplifier. These characteristics are similar to those provided by a loop with a very low cut-off filter. However, there is one important difference, once the loop is locked, it can track rapid changes in input frequency (within the normal limitation for a phase-locked loop).

Figure 3:
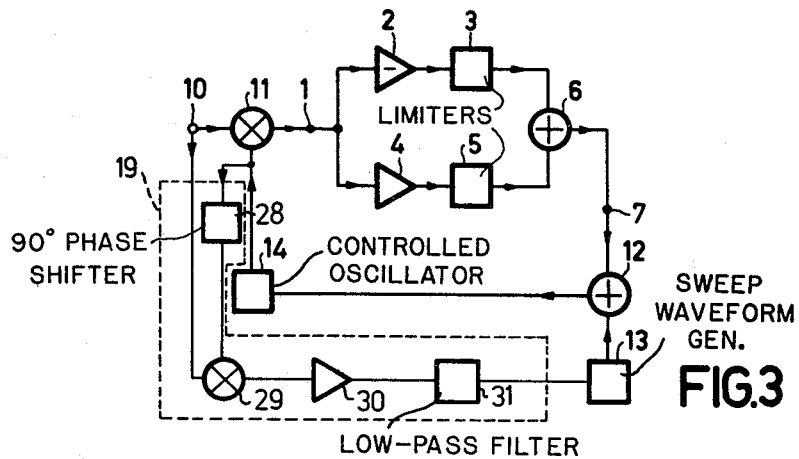
FIG. 3 shows a first embodiment of a phase-lock loop including the amplifier circuit arrangement in accordance with the invention.

FIG. 3 shows a phase-locked loop including the amplifier circuit arrangement of FIG. 1. The phase-locked loop comprises an input 10 which is coupled to a first input of a phase sensitive detector 11, the output of a voltage controlled oscillator 14 being coupled to a second input of the phase sensitive detector 11. The amplifying circuit shown in FIG. 1 is connected between the output of the phase sensitive detector 11 and one input of a summing circuit 12. A sweep waveform generator 13 is coupled to a second input of the summing circuit 12 the output of which is coupled to a control input of the oscillator 14. When an input signal is applied to an input 10 of the phase-locked loop, the phase sensitive detector 11 produces at its output a beat frequency signal corresponding to the difference between the frequency of the input signal at input 10 and the frequency of the oscillator 14. This beat frequency signal will have a large amplitude and hence the output of the summing circuit 6 will be substantially zero. The output of sweep waveform generator 13 will cause the frequency of the oscillator 14 to sweep across the desired range and when the frequency of the oscillator 14 approaches that of the input signal the output of the phase sensitive detector 11 will fall to a low level. Thus the amplifier circuit arrangement will produce an output signal at the output 7 to lock the oscillator 14 to the input signal frequency. The sweep waveform generator 13 is then disabled and the loop will now track any changes in input signal frequency. The output of the sweep waveform generator 13 may be disabled by means 19 for detecting the in-lock condition and for applying a control signal thus generated to a control input of the sweep waveform generator. Such an arrangement will be described later with reference to FIG. 6.

Figure 4:
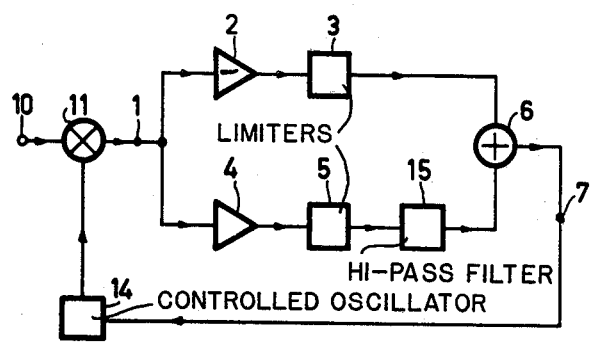
FIG. 4 shows a second embodiment of a phase-locked loop including the amplifier circuit arrangement in accordance with the invention.

A modification of the phase-locked loop shown in FIG. 3 which eliminates the requirement for a sweep waveform generator 13 is shown in FIG. 4. As shown in FIG. 4, the amplifier circuit arrangement is modified by inserting a high-pass filter 15 between the limiter 5 and summing circuit 6, the output of the summing circuit 6 being fed directly to the oscillator 14. In this arrangement of the phase-locked loop, the beat waveform produced by the phase sensitive detector 11 when the loop is unlocked, is only cancelled if it passes via the high-pass filter 15. The cut-off frequency of the high-pass filter 15, for example 3.5 KHz, is chosen to be equal to the required lock range. In practice, this filter can be a simple RC network. Thus if the beat frequency is below the cut-off frequency of the high-pass filter 15 a signal will be produced at the output of summing circuit 6 causing the frequency of oscillator 14 to lock on to the input signal.

Figure 5:
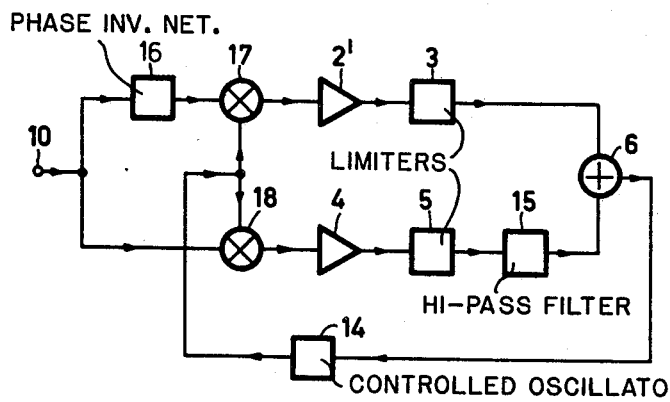
FIG. 5 shows a third embodiment of a phase-lock loop including the amplifier circuit arrangement in accordance with the invention.

An alternative but equivalent arrangement to that shown in FIG. 4 is shown in FIG. 5. In FIG. 5, the phase sensitive detector 11 is replaced by two separate phase sensitive detectors 17 and 18. The input signal is filter coupled between one of said first and second amplifiers and said summing means, and means for limiting the output signals of said first and second amplifiers to a predetermined level, an output of said summing means being an output of said arrangement, wherein the gains of said first and second amplifiers are unequal for low amplitude signals applied to said arrangement, characterized in that the phase sensitive detector means comprises a first and a second phase sensitive detector, each having first and second inputs and an output, the second inputs of the first and second phase sensitive detectors being commoned and connected to the output of the controllable oscillator, the input signal being inverted and fed to the first input of the second phase sensitive detector, the output of the first phase sensitive detector being fed to the input of the first amplifier and the output of the second phase sensitive detector being fed to the second amplifier.

* * * * * fed directly to phase sensitive detector 18 and to the phase sensitive detector 17 via a phase inverting network 16. The output of phase sensitive detector 17 is fed to the input of an amplifier 2' which is equivalent to the amplifier 2 but which is non-inverting, while that of the phase sensitive detector 18 is fed to the input of the amplifier 4. The output of the oscillator 14 is fed to the second inputs of the phase sensitive detectors 17 and 18. In this arrangement the input to one of the phase sensitive detectors is inverted and this is equivalent to inverting the output. This can be achieved simply, for example, by reversing the connections to a balanced input phase detector. The addition of a second phase sensitive detector is convenient as certain operational amplifiers can act as phase detectors. In a particular embodiment, the phase detectors, loop amplifiers and limiters are provided by an operational transconductance amplifier type CA3060 manufactured and sold by Radio Corporation of America. This device includes three amplifiers in a single package each of which can perform the function of phase sensitive detector, amplifier and limiter.

Figure 6:
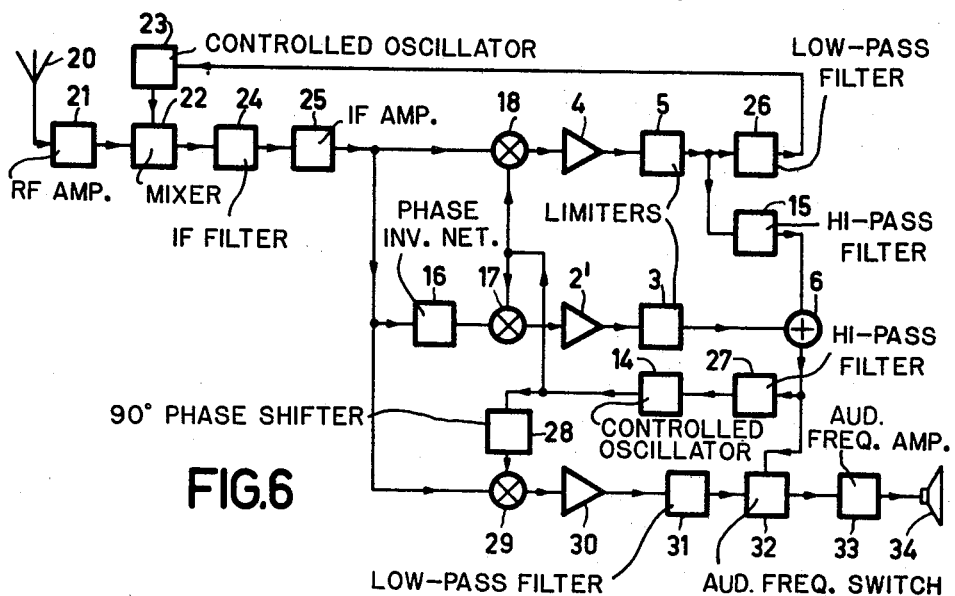
FIG. 6 shows a radio receiver including the phase-locked loop sown in FIG. 5.

FIG. 6 is a block schematic diagram of a radio receiver incorporating the amplifier arrangement in accordance with the present invention. The receiver comprises an aerial 20 connected to the input of a radio frequency amplifier 21, the output of which is fed to the first input of a mixer stage 22. The output of a controlled local oscillator 23 is fed to a second input of the mixer 22. The output of the mixer 22 is fed via an IF filter 24 and an IF amplifier 25 to a first input of each of phase sensitive detectors 18 and 29 and to phase inverting network 16. The output of the phase sensitive detector 18 is fed, via the amplifier 4, the limiter 5 and a low-pass filter 26, to a control input of the local oscillator 23. The output of limiter 5 is also fed, via a high-pass filter 15, to the first input of the summing circuit 6. The output of phase inverting network 16 is fed to a first input of phase sensitive detector 17, the output of which is fed, via amplifier 2' and limiter 3, to the second input of summing circuit 6. The output of summing circuit 6 is fed, via a high pass filter 27 to a control input of oscillator 14, the output of which is fed to the second input of phase sensitive detectors 17 and, 18 and via a 90° phase shifting network 28 to the second input of phase sensitive detector 29. The output of phase sensitive detector 29 is fed, via an amplifier 30 and a low-pass filter 31, to a first input of an audio frequency switch 32. The output of summing circuit 6, which comprises the audio frequency modulating signal, is additionally fed, via the audio frequency switch 32, which is rendered conductive in response to the receiver locking, to audio frequency amplifier 33, the output of which feeds a transducer 34.

The operation of the basic dual locked loop receiver has been described in the paper read by Stephen W. Watkinson at the Communications 74 exhibition referred to herein before.

In the receiver shown in FIG. 6, the loop amplifier shown in FIG. 8 of the paper is replaced by the amplifier arrangement shown in FIG. 5. This modifies the operation of the receiver from that described in the Watkinson paper in that the cut-off frequency of the high-pass filter 15 will define the range of frequencies over which the oscillator 14 will lock on to the input signal and provided that the cut-off frequency of the high-pass filter is less than the channel spacing will considerably reduce the tendency of the receiver local oscillator to pull over towards the adjacent channel and thus reduce the adjacent channel selectivity.

I claim:

1. A phase-locked loop comprising a phase sensitive detector having first and second inputs and an output, means for feeding an input signal to the first input of the phase sensitive detector, a controllable oscillator, means for feeding the output of the oscillator to the second input of the phase sensitive detector, and means for coupling the output of the phase sensitive detector to a control input of the oscillator, characterized in that said coupling means comprises an amplifier circuit arrangement having an input for receiving said phase sensitive detector output, a first amplifier having a non-inverting input coupled to said input, a second amplifier having an inverting input also coupled to said input, and means for summing the output signals of said first and second amplifiers, an output of said summing means being coupled to an output of said arrangement, wherein the gains of said first and second amplifiers are unequal for low amplitude signals applied to said arrangement and said first and second amplifiers being arranged to produce substantially equal antiphase limited outputs for high amplitude signals applied to said arrangement, said coupling means further comprising means for adding the output of a sweep waveform generator to the output of the amplifier circuit arrangement and means for disabling the output signal of the sweep waveform generator when the phase-locked loop is locked.

2. A phase-locked loop comprising a phase sensitive detector having first and second inputs and an output, means for feeding an input signal to the first input of the phase sensitive detector, a controllable oscillator, means for feeding the output of the oscillator to the second input of the phase sensitive detector, and means for coupling the output of the phase sensitive detector to a control input of the oscillator, characterized in that said coupling means comprises an amplifier circuit arrangement having an input for receiving said phase sensitive detector output, a first amplifier having a non-inverting input coupled to said input, a second amplifier having an inverting input also coupled to said input, means for summing the output signals of said first and second amplifiers, and a high-pass filter coupled between one of said first and second amplifiers and said summing means, an output of said summing means being coupled to an output of said arrangement, wherein the gains of said first and second amplifiers are unequal for low amplitude signals applied to said arrangement and said first and second amplifiers being arranged to produce substantially equal antiphase limited outputs for high amplitude signals applied to said arrangement.

3. A phase-locked loop comprising phase sensitive detector means having first and second input means and output means, means for feeding an input signal to the first input means of the phase sensitive detector means, a controllable oscillator, means for feeding the output of the oscillator to the second input means of the phase sensitive detector means, and an amplifier circuit arrangement for coupling the output means of the phase sensitive detector means to a control input of the oscillator, wherein said amplifier circuit arrangement comprises input means coupled to the output means of said phase sensitive detector means, a first amplifier having a non-inverting input coupled to said input means, a second amplifier also having a non-inverting input coupled to said input means, means for summing the output signals of said first and second amplifiers, a high-pass